US008391352B2

(12) United States Patent
Washburn (10) Patent No.: US 8,391,352 B2
(45) Date of Patent: Mar. 5, 2013

(54) LOW-COST ATSC-RECEIVER-COMPATIBLE DIGITAL TV MODULATOR

(75) Inventor: Clyde Washburn, Victor, NY (US)

(73) Assignee: Integre Technologies, Inc., Pittsford, NY (US)

( * ) Notice: Subject to any disclaimer, the term of this patent is extended or adjusted under 35 U.S.C. 154(b) by 1331 days.

(21) Appl. No.: 12/119,595

(22) Filed: May 13, 2008

(65) Prior Publication Data

US 2009/0284663 A1 Nov. 19, 2009

(51) Int. Cl.
*H04B 1/66* (2006.01)

(52) U.S. Cl. .................................. 375/240; 375/280
(58) Field of Classification Search .................. None
See application file for complete search history.

(56) References Cited

U.S. PATENT DOCUMENTS

| | | | |
|---|---|---|---|
| 4,183,054 A | 1/1980 | Patisaul et al. | |
| 4,771,395 A | 9/1988 | Watanabe et al. | |
| 5,801,595 A | 9/1998 | Davis et al. | |
| 6,711,214 B1* | 3/2004 | Hershberger | 375/285 |
| 6,724,832 B1 | 4/2004 | Hershberger | |
| 7,085,324 B2 | 8/2006 | Choi et al. | |
| 7,095,799 B2 | 8/2006 | Braithwaite | |
| 7,298,786 B2 | 11/2007 | Choi et al. | |
| 2004/0056785 A1* | 3/2004 | Webster et al. | 341/61 |
| 2005/0127959 A1* | 6/2005 | Leifso et al. | 327/117 |
| 2007/0247944 A1* | 10/2007 | Fischer et al. | 365/212 |
| 2008/0056337 A1* | 3/2008 | Tal et al. | 375/219 |

OTHER PUBLICATIONS

Advanced Television Systems Committee, "ATSC Digital Television Standard Part 2—RF/Transmission System Characteristics", Jan. 3, 2007, Doc. A/53, Part 2:2007, pp. 1-44, Advanced Television Systems Committee, 1750 K Street, N.W., Suite 1200, Washington, DC 20006 (www.atsc.org).
Bryan Douglas, "Voice Encoding Methods for Digital Wireless Communications Systems", Southern Methodist University, Fall 1997, pp. 1-15, EE6302 Section 325.
David L. Hershberger, "Architecture of a DSP Based Dual-Mode ATSC/NTSC Television Exciter and Transmitter", Continental Electronics, Inc., Grass Valley, California, pp. 1-8.
David Sparano, "What Exactly is 8-VSB Anyway?" This article is the third edition of an article originally appearing in 1997, previous editions have appeared on the Harris Corporation Broadcast Website and the Miller Freeman Guide to Digital Television, pp. 1-14.
Gary Sgrignoli, "ATSC Transmission System: VSB Tutorial", Zenith Electronics Corporation, 1000 N. Milwaukee Ave., Glenview, IL 60025, pp. 1-20.

* cited by examiner

*Primary Examiner* — Sath V Perungavoor
*Assistant Examiner* — Kate Luo
(74) *Attorney, Agent, or Firm* — Hiscock & Barclay, LLP (57) ABSTRACT

A method and apparatus by which ATSC-receiver-compatible digital TV signals may be generated without most of the discrete and/or high-complexity components required by the ATSC specification, through the use of a precomputation of digital filter coefficients that consolidates multiple functions into a single step, and through the derivation of multiple required carrier frequencies using a single oscillator circuit. The resulting design meets all requirements of the ATSC specification, reducing significantly the cost of the necessary signal-processing functions, and in a manner compatible with the VLSI (very-large-scale-integrated) circuit technologies of the field.

25 Claims, 6 Drawing Sheets

LOW-COST ATSC-RECEIVER-COMPATIBLE DIGITAL TV MODULATOR

FIELD OF THE INVENTION

This invention concerns electronic circuits, more specifically electronic circuits used in the processing of digital television signal processing.

BACKGROUND OF THE INVENTION

ATSC (Advanced Television Standards Committee) Digital TV, as mandated for broadcast use by the FCC, requires specialized signal processing in the television receiver modulator which is not amenable to low-cost implementation in consumer electronics. This requirement has so far prevented the introduction of low-cost modulators in digital television products to provide the same functionality as the ubiquitous NTSC (National Television Standards Committee) modulators in analog NTSC TV products.

The technology of advanced television systems using digital television signal processing, including the processing of high-definition television (HDTV) signals for consumer broadcast, reception, and presentation, incorporates many advanced signal-processing concepts, methods, and devices. The field's technology addresses the general problem of transmitting high-definition and rapid-motion video streams via both wireless and other modes of communication to large numbers of users concurrently at reasonable cost. The standards for advanced television systems are published by the Advanced Television Standards Committee (ATSC), and are available at www.atsc.org/standards.html. The ATSC standard of particular interest with respect to the present invention is the ATSC Digital Television Standard A/53, incorporated herein by reference.

Also of particular relevance to the present invention is the MPEG-2 standard used to encode moving pictures and associated audio information. The MPEG-2 standard is in continuous evolution—copies of the standard, identified as ISO/IEC 13818, may be purchased at the International Standards Organization (ISO) at the ISO Website: www.iso.org/iso/iso_catalogue/, also incorporated herein by reference.

As defined by the ATSC standard in the present art, the modulation of the MPEG-2 transport stream carrying the information for the viewer is performed using an 8-VSB (8-bit vestigial sideband) modulator. The 8-VSB modulator converts the MPEG-2 stream into a radio-frequency signal to be broadcast or otherwise conveyed to the user's receiver for demodulation, decoding, and presentation as images and sound. An informative article on the 8-VSB modulation process is titled "What Exactly is 8-VSB Anyway?", by David Sparano, available on the Web at http://www.broadcast.net/~sbe1/8vsb/8vsb.htm and incorporated herein by reference.

The modulation process as described by ATSC Standard: Digital Television Standard (A/53), Revision D, 19 Jul. 2005 consists of the following steps:

1. The MPEG-2 transport stream is processed as described in the standard cited hereinabove and applied to an 8-VSB modulator. In the present art, the digital processing required prior to the 8-VSB modulator is readily accomplished by integrated circuits and does not create a significant cost or complexity problem.
2. The resulting channel stream applied to the S-VSB modulator is post-filtered by a raised-cosine-squared Nyquist filter to confine the signal to the allocated 6 MHz-wide channel, and to form a matched filter in combination with the second raised-cosine-squared filter in the television receiver. Because of the severe restrictions placed by the FCC on radiation in adjacent channels this filtering is sophisticated, and is typically done at low intermediate frequencies (IFs) such as 45 MHz, where thermal drift of the components is not a problem in maintaining the exacting filter profile.
3. The resulting IF ATSC signal must then be frequency-converted to the desired channel, and the resulting undesired image mixing product suppressed by filtering where it falls in the TV band(s), either directly or by subsequent conversions.
4. Allowing the modulator to be channel-agile, meaning that the modulator can process signals acceptably and uniformly for output on any channel, normally requires additional complexity, typically by conversion of the IF ATSC signal first to a $2^{nd}$ high IF above the TV bands, so that a second conversion to a selectable final channel may be done using a low-pass filter to suppress $2^{nd}$ IF feed-through
5. The pilot carrier frequency in the final channel is initially positioned to center the signal's upper sideband in the 6-MHz channel, and may be modified by exacting offsets under certain conditions of adjacent or co-channel usage. This combination of precision and agility requires elaborate frequency synthesis.

The modulator constructed in accordance with the above steps is both too large and too expensive to replace NTSC modulators in consumer equipment as it is migrated to support ATSC digital TV.

For additional background, two articles, one titled "A Compatible Narrowband 8VSB Transmission System", published by Axcera of Lawrence, Pa., available at http://broadcast.axcera.com/bet_paper.pdf, and the other titled "Architecture of a DSP Based Dual-Mode ATSC/NTSC Television Exciter and Transmitter", by David L. Hershberger, Continental Electronics, Inc., available at http://www.contelec-.com/pdf%5Cdspdtv.pdf, are incorporated herein by reference.

A good general reference on digital signal processing is the book titled "Understanding Digital Signal Processing" by Richard G. Lyons, Addison Wesley Longman 1997, ISBN 0-201-63467-8.

SUMMARY

The invention provides a method and apparatus by which ATSC-receiver-compatible digital TV signals may be generated without most of the discrete and/or high-complexity components required by the ATSC specification. The invention achieves its unique simplifications both through a pre-computation of digital filter coefficients that consolidates multiple functions into a single step, and through the derivation of multiple required carrier frequencies using a single oscillator circuit. The invention accomplishes its purpose in a manner that is capable of meeting all requirements of the ATSC specification, while reducing significantly the cost of the necessary signal-processing functions, and in a manner compatible with the VLSI (very-large-scale-integrated) circuit technologies of the field.

BRIEF DESCRIPTION OF THE DRAWINGS

The present invention is disclosed with reference to the accompanying drawings, wherein.

DETAILED DESCRIPTION OF THE INVENTION

The architecture described by the requirements of the prior art has raised cost and complexity issues that impede the inclusion of ATSC-standard television modulators in consumer electronics. The present invention mitigates these problems through the construction of a simplified modulator more suited to the limited space and cost objectives of consumer electronics while providing the following functions.

1. selects the UHF television channel range of desired for the signal output,
2. uses carefully-placed IF (intermediate frequency) carrier and LO (local oscillator) frequencies,
3. uses the Weaver modulator architecture to fold the signal during processing,
4. eliminates the use of D-to-A (digital-to-analog) trellis encoders followed by a conventional balanced modulator normally required by the Weaver modulator,
5. tunes the finite impulse response (FIR) filter ROM tap values for improved output D-to-A dynamic range utilization,
6. uses a single crystal oscillator to derive reference frequencies that are sufficiently high to facilitate spurious filtering and provide acceptable phase noise characteristics.

Most agile consumer NTSC modulators provide output on UHF channels, and most ATSC broadcasts are on UHF. Furthermore, the FCC has announced that UHF channels 52 and above are being reassigned to other services. UHF channels 14-51 are uniformly spaced 6 MHz apart. The invention therefore provides for the processing of agile ATSC output in the UHF channel 14-51 range, which offers the highest flexibility with lowest complexity. The resulting output frequency band is then 470-698 MHz.

Since the output band is substantially less than one octave, and since it is desirable that no IF or LO harmonics should appear in the output band, the invention places the fixed IF below the output band, but above half the frequency of the bottom of the output band (470 MHz), and places the LO frequency above the output band.

Figure 4:
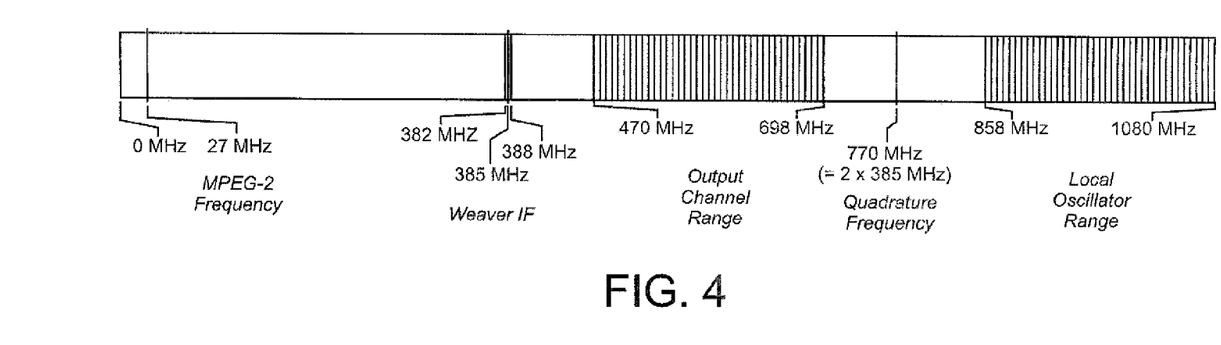
FIG. 4 shows the invention's use of the radio-frequency spectrum.

In an optimized embodiment, the invention places the IF geometrically approximately the same ratio below the output band as the lowest LO frequency is above the output band, thereby allowing similar geometric cutoff rates for the upper and lower slopes of the output bandpass filter. This optimization also allows the shared use of a base oscillator frequency for both IF and LO generation, simplifying the invention's implementation. See FIG. 4. The invention uses a local oscillator (LO) frequency which is a multiple of 6 MHz, simplifying the synthesis of frequencies in 6 MHz steps to match the spacing of the UHF channels. On the basis of this usage, the invention derives a nominal IF frequency of 382-388 MHz and a nominal LO frequency of 858-1080 MHz, placing the lowest output frequency at 1.21 times the highest IF frequency, and the lowest LO frequency at 1.23 times the highest output frequency, i.e. approximately equal ratios. The invention also provides for adjustment of the IF and LO frequencies in 6 MHz increments or some submultiple thereof thereby simplifying the design of the bandpass filter noted above, and allowing optimum positioning of the undesired IF and LO signals on its rejection slopes.

The Weaver modulator used in the present invention is a modulator design and implementation that uses low-pass filters and quadrature mixers to eliminate one sideband of the incoming signal to create a vestigial-sideband (VSB) output signal at a specific baseband center frequency.

To reduce cost and complexity, the invention incorporates the Weaver modulator architecture to fold the signal around its baseband center frequency, while producing I and Q (In-phase and Quadrature) versions of the half-baseband signals, which when low-pass filtered may then be quadrature recombined to produce a single-sideband signal with the original baseband content in its one sideband. This technique allows a single low-pass filter to shape both the upper and low edges of the baseband, providing the symmetry desired in the ATSC signal spectrum, and control of emissions in the adjacent channels. In contrast to the prior art, the invention eliminates the use of a separate D-to-A trellis modulator followed by a balanced modulator, conventionally employed with Weaver modulation.

Figure 1:
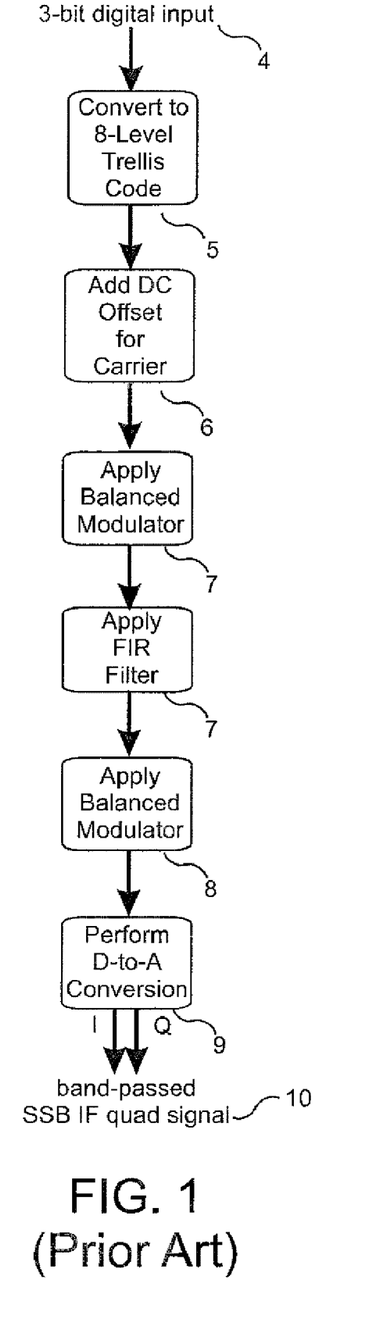
FIG. 1 summarizes the processing of the MPEG-2 video stream, from the trellis encoding stage to the digital-to-analog conversion stage, according to the present art.

See FIG. 1. In the conventional implementation, the 3-bit digital input 4 from Reed-Solomon encoding and pseudorandomization would be converted 5 to an 8-bit trellis code, and a DC offset added 6 to insert the desired amount of carrier signal. The resulting signal would then be processed 7 by a balanced modulator followed by an FIR (finite impulse response) digital filter, producing a low-pass-filtered quadrature baseband signal. The baseband signal would then be applied 8 to a second set of balanced modulators, and the result processed 9 through digital-to-analog conversion, resulting in a band-passed single-sideband (SSB) signal including quadrature as required 10. The trellis coding, carrier insertion, balanced modulation, filtering, and second balanced modulation comprise five separate stages of processing. The present invention combines four of the five stages into a single stage, thereby simplifying and accelerating the processing of the signal.

Figure 2:
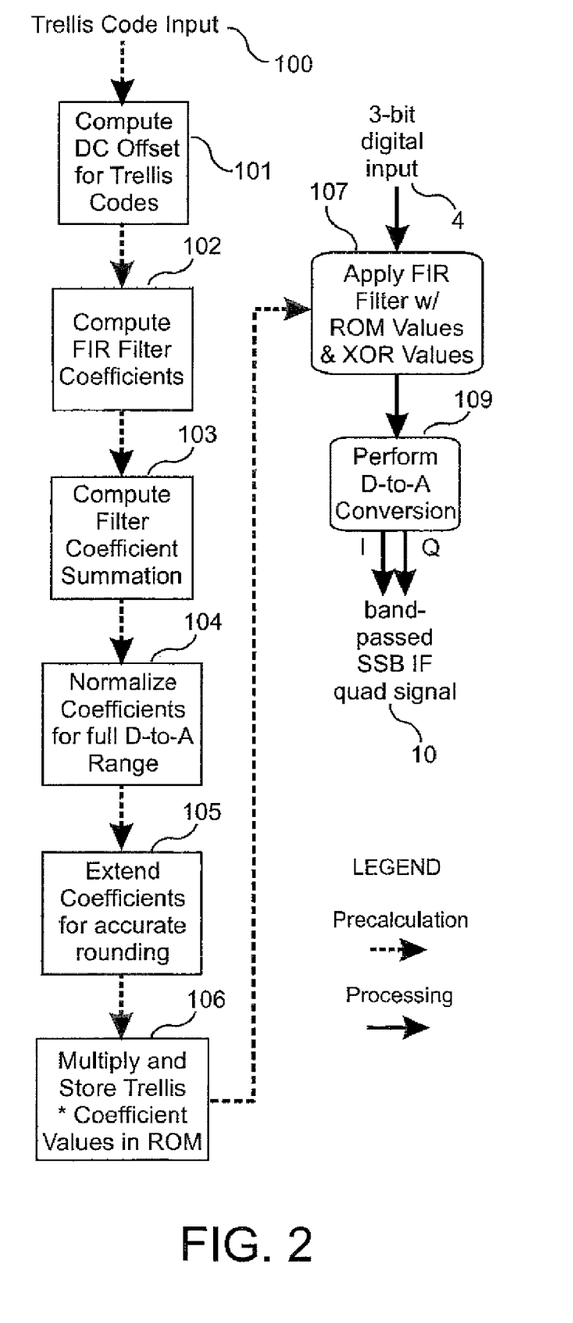
FIG. 2 summarizes the processing of the MPEG-2 video stream through the same stages as in FIG. 1 according to the invention.

To combine the processing steps, the invention precomputes all values required for all of the four processing steps, and uses the precomputed values as FIR filter coefficients in a single filtering processing step that accomplishes all the processing of the Weaver modulator. See FIG. 2. In summary, the invention accomplishes the following objectives:

1. The invention precomputes the trellis magnitude 100 required for each FIR step, multiplying the trellis magnitude after addition of the desired carrier insertion offset by the desired FIR tap weights, and using the products as 3-bit address normalized tap weights in the FIR ROMs. This precomputation eliminates the need for the D-to-A trellis coding.

2. During processing, the invention duplicates the effects of using balanced modulators, i.e., reversal of the modulation waveform polarity, by reversing the binary value of each FIR tap when required. This has the same effect as if the input had been reversed in polarity. The invention accomplished this effect by applying an XOR (exclusive-OR) bitwise operation to the FIR ROM ones-complement output under control of a phase signal at the balanced modulator carrier frequency, causing the binary value of each FIR tap to reverse at that rate. This simple reuse of the binary FIR tap values eliminates the separate modulation step ordinarily required to provide balanced modulator output.

3. The invention further scales 104 the FIR ROM tap values during precomputation so that the highest total value reached on the largest step is just at the full scale of the D-to-A conversion, thereby utilizing the converter to its full capacity, and maximum dynamic range.

4. The invention extends 105 the FIR ROM taps in bit depth at the LSB (least-significant-byte) end of the ROM addresses, so that the final summation arriving at the D-to-A converter is accurate to within one LSB-range of addresses in the D-to-A converter.

In a preferred embodiment, the invention precomputes the FIR filter tap values, and computes filter outputs usable in the D-to-A stage, through the following steps, as shown in FIG. 2:

1. Select a digital representation that can produce the negative of a value using a simple exclusive-or (XOR) operation. The ones-complement representation is an example of such a representation.

2. The required trellis encoding uses eight levels having the values −7, −5, −3, −1, +1, +3, +5, +7, and the required pilot carrier insertion level is +1.25 units relative to the trellis code insertion scale. Map the trellis code values summed with the pilot carrier insertion level to produce a new trellis having the values −5.75, −3.75, −1.75, +0.25, +2.25, +4.24, +6.25, +8.25. The new trellis code values map to a 7-bit signed value with the least-significant bit (LSB) signifying 0.25 ($2^{-2}$) and the most-significant bit (MSB) signifying 8 ($2^3$), giving 6 bits of value plus a sign bit. Since there are still only eight unique trellis levels, the 7-bit signed value can still be represented as a 3-bit ROM input.

3. Determine 102 the coefficients (tap values) of a suitable FIR filter. The ATSC requirements specify target filter responses for the passband, transition band, and stopband of the signal being filtered. The determination of suitable FIR filter coefficients is a process well-known in the art, which will produce the desired filter coefficients and resultant response characteristics. Using the coefficients produced and a peak signal level, compute 103 the step-by-step processing weights for the peak signal level (+8.25) from the trellis values of the previous step.

4. Normalize 104 the filter coefficients so that the maximum computed 103 input level times the filter coefficient summation will be the maximum signed input value usable in the D-to-A conversion process, i.e., (0FFFF . . . ), thereby utilizing fully the dynamic range of the D-to-A converter.

5. Determine 105 the number of bits required to maximize the spectral purity of the processed signal as follows. First, assume that each coefficient reaches a rounded-high level, so that every result is rounded upwards. The result is that the output level would be too high by an error factor of the integer equal to the number of coefficients divided by 2, or for the case of 31 coefficients, 16 (=$2^4$), requiring 4 bits. But adding one bit to the coefficient size, making 5 added bits, produces correctly-rounded results using simple truncation. Given the 7-bit trellis and the 5-bit addition, the coefficients therefore require 12 bits during processing, which may be truncated to 8 bits after final summation.

6. There are only 3 bits of input to the FIR filter, not including the carrier phase input. Consequently, store 106 the 12-bit coefficients, indexed by the 8 trellis values, in a lookup read-only memory (ROM) having a 3-bit lookup input.

7. The FIR filter coefficients have values symmetrical around the center of the filter, so that given an odd number N of filter taps, the $n^{th}$ filter tap and the $(N-n+1)^{th}$ filter tap have the same values in the filter ROM. This characteristic of the FIR filter optionally permits use of the same ROM unit twice: once for stage n and once for stage N−n+1, during processing in a single step, if the hardware required to look up and hold two input values is less burdensome than duplication of the ROM. See FIG. 6A for a single-ROM embodiment of the invention.

8. In digital signal processing in the present invention, the production of a balanced modulator signal requires only a phase reversal of the filter output. The carrier phase input signal is used to trigger the computation of filter stage output using the XOR (e.g., twos-complement) of the ROM output value, thereby producing a negated output value.

9. At the carrier frequency, the trellis step durations equal 90 degrees of phase at the balanced modulator carrier frequency. Thus the trellis level is the same for both I and Q, with a relative delay of 90 degrees of carrier phase. Accordingly, duplication of the FIR filter is avoided by instead providing two outputs from a single filter, the direct output (I) and the same output delayed 90 degrees in a latch. This simplification can be extended to the design of the following D/A converter, which can be made to accept a single input, and provide quadrature output by introduction of a 90 degree delay in a second Analog output. (Q). Most of the steps listed above, i.e., the trellis encoding, the inclusion of DC offset 101, the FIR filter coefficient computation 102, the coefficient normalization 104 and extension 105, and the computation of modified FIR filter coefficient values 106, are performed at the time the circuit is designed and built, and in combination are accomplished in a single FIR filter processing step at the time a signal is processed 107, 109, producing the same band-passed single-sideband signal, with quadrature, 10 as in the prior art. Because the output of the FIR filter includes both the processed input signal and the quadrature of that signal, the invention's single FIR filtering step digitally eliminates the need for handling differential delay distortion at baseband frequencies in any subsequent analog filters after digital-to-analog conversion, an advantage of the invention. The ability of the digital filtering process to maintain precise phase relationships between the basic signal and its quadrature feeds an ideal input to the analog modulation process that follows, thereby eliminating expensive and difficult filtering in the analog realm.

Figure 5:
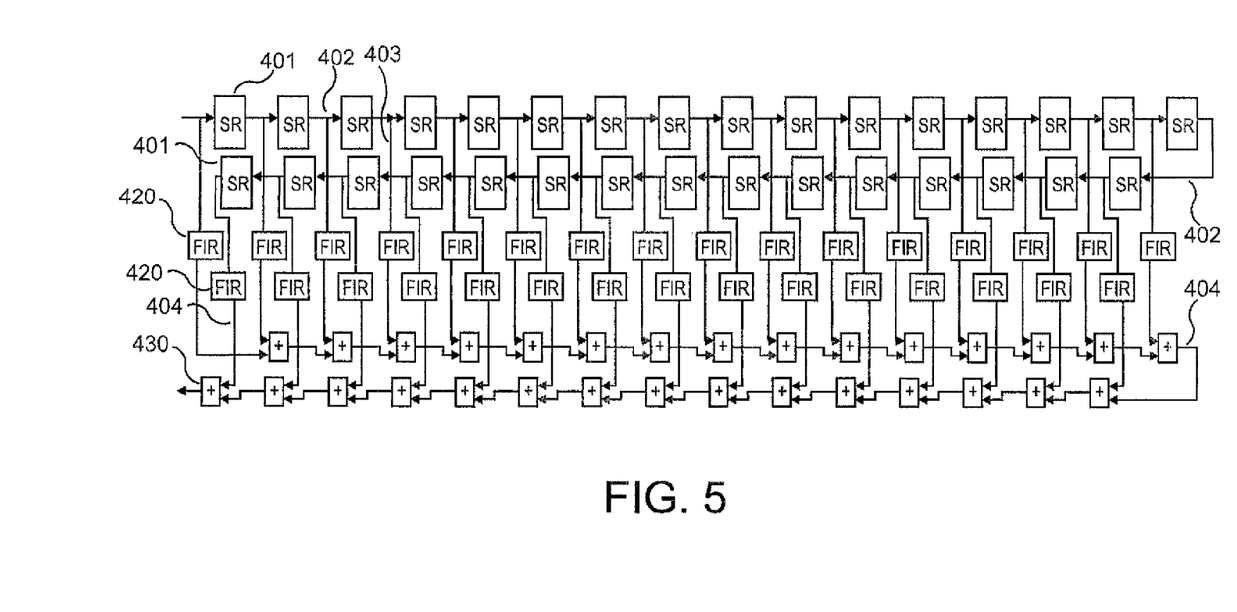
FIG. 5 summarizes the structure and data flow of the invention's finite-impulse-response (FIR) filter.

The invention's example FIR filter contains 31 shift registers 401, selected as the smallest number considered capable of producing the root-raised-cosine filtering results in passband, transition band, and stopband as defined by the ATSC specification. See FIGS. 5, 6, and 7. FIG. 5 shows the overall configuration of functions in the FIR filter. The shift registers 401 are connected serially, so that each 3-bit signal input moves as shown 402 from register to register. Tap lines 403 between registers capture the signal for output calculation and summation. Each tap line 403 provides input to a filter tap 420, where the filter tap coefficient outputs have been precalculated and stored. Each filter tap 420 sends its selected output via an output bus 404 to an adder circuit 430 connected to the previous adder circuit 430 and the next adder circuit 430. The final adder circuit 430 supplies the final sum to an accumulator circuit as in a conventional FIR filter.

Figure 6:
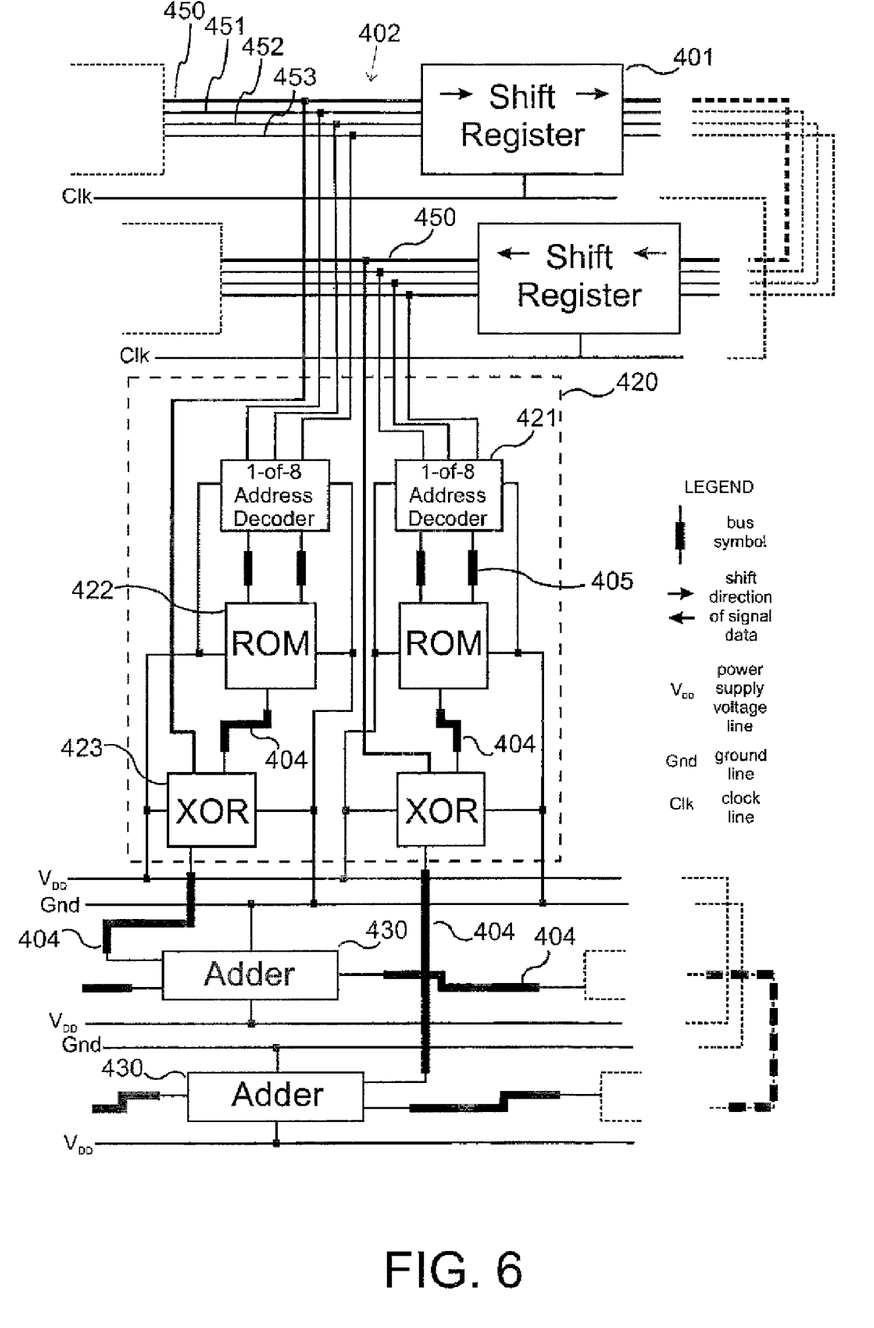
FIG. 6 shows the component structure of one stage of the FIR filter of FIG. 5 using a separate ROM unit for each shift register.

FIG. 6 shows a closeup view of a pair of shift register stages. Each shift register stage comprises one shift register 401, one filter tap 420, and one adder 430, connected as shown. Each filter tap 420 further comprises an address decoder 421, a read-only memory 422, and an XOR converter 423. The shift registers 401 are connected to each other via a carrier line 450 and three data lines 451, 452, 453. Each address decoder is connected to a ROM by address buses 405. Each ROM is connected to an XOR converter by a data bus 404. The adders are connected to each other and to the XOR converters via data buses 404.

Figure 6A:
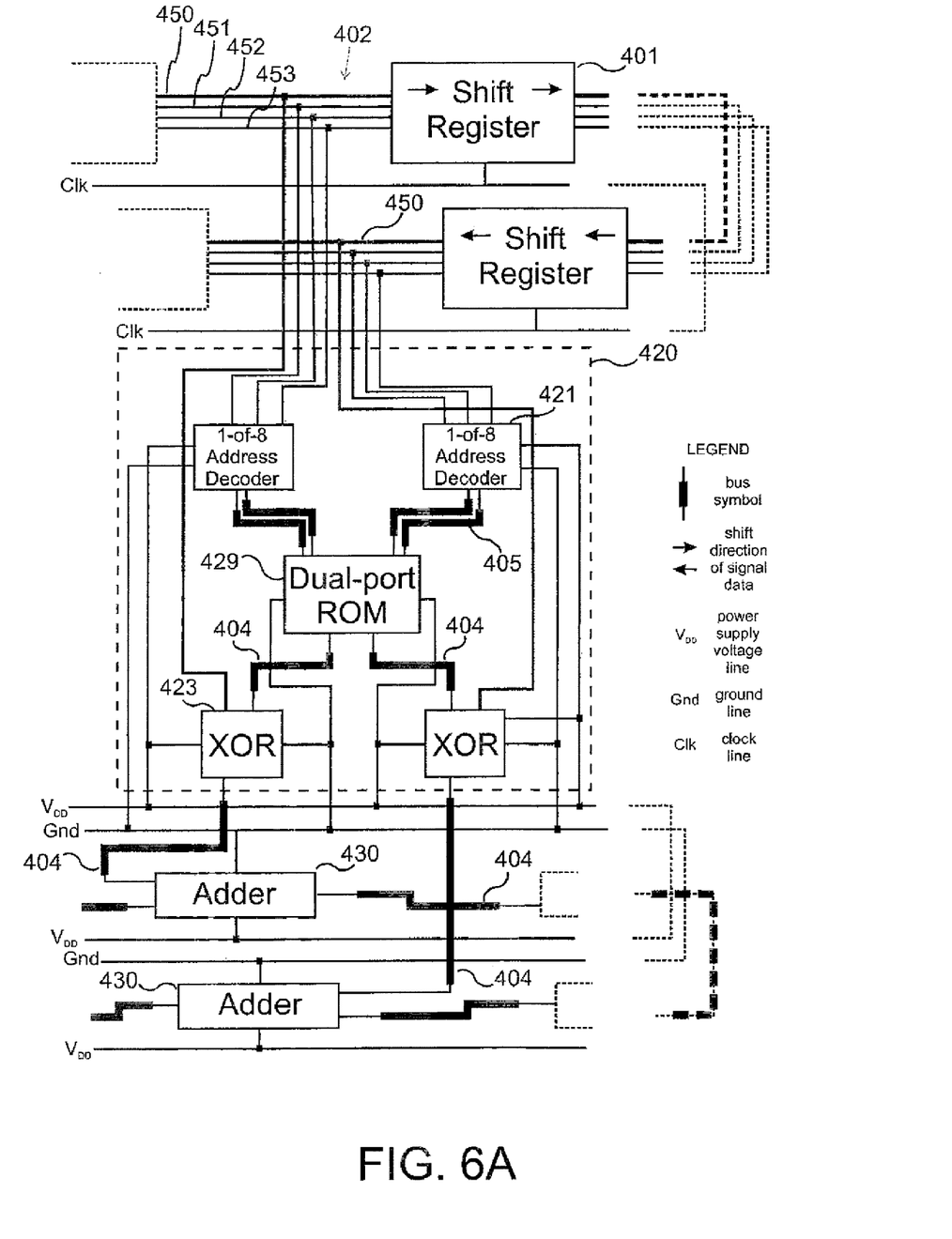
FIG. 6A shows the component structure of one stage of the FIR filter of FIG. 5 using a shared ROM for each pair of shift registers having the same stored coefficient values.

FIG. 6A shows a closeup view of a pair of shift register stages in which the ROMs 422 for each matching pair of filter taps shown in FIG. 6 have been merged into a single ROM 429. As in FIG. 6, each shift register stage comprises one shift register 401, one filter tap 420, and one adder 430, connected as shown. Each filter tap 420 further comprises an address decoder 421, access to a read-only memory 429, and an XOR converter 423. The shift registers 401 are connected to each other via a carrier line 450 and three data lines 451, 452, 453. Each address decoder is connected to a ROM by address buses 405. Each ROM is connected to an XOR converter by a data bus 404. The adders are connected to each other and to the XOR converters via data buses 404.

Figure 7:
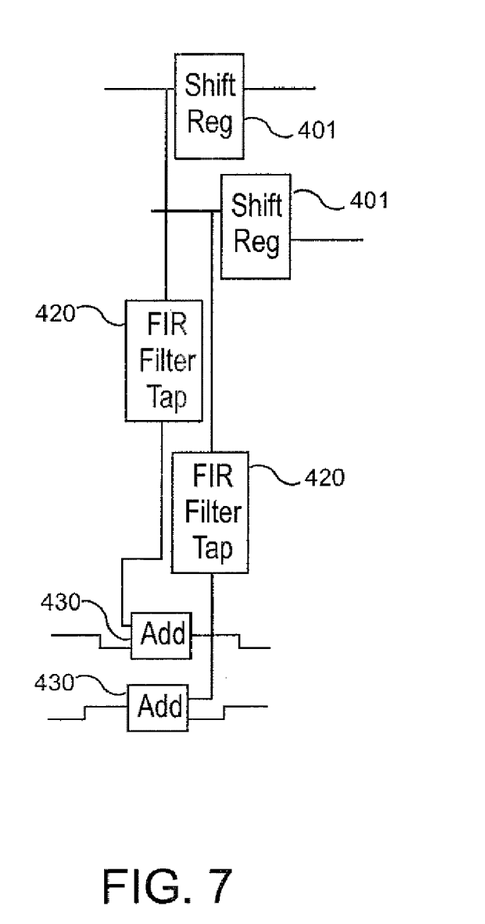
FIG. 7 shows the simplified block structure of one stage of the FIR filter of FIG. 5.

In embodiments in which the precomputed filter tap coefficients are the same for filter stages equidistant from the middle of the filter, the invention provides for the use of dual-port ROM, allowing the use of a single ROM for each pair of such filter stages. FIG. 7 provides a block-level view of one shift register pair of FIG. 5.

Figure 8:
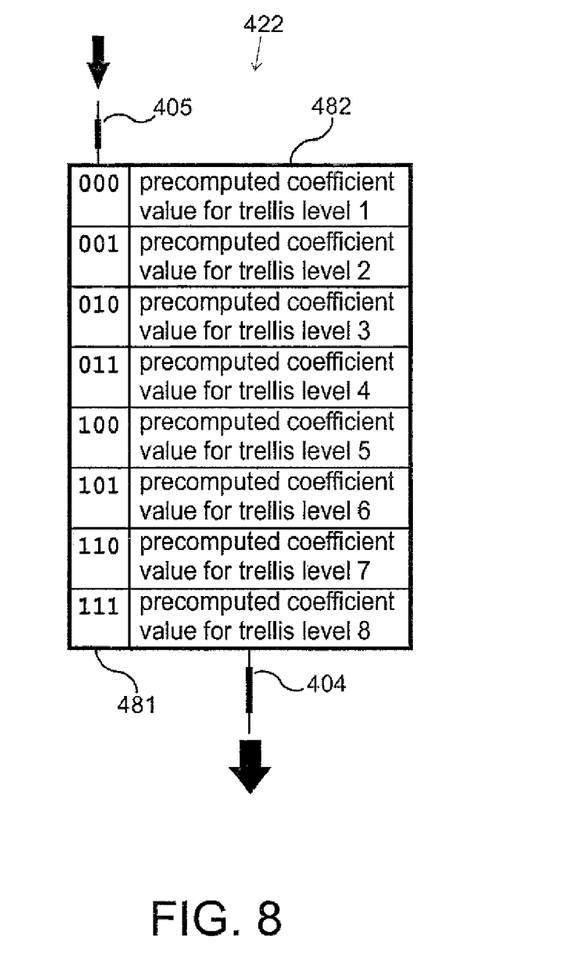
FIG. 8 shows the invention's FIR filter tap coefficient ROM storage and addressing.

FIG. 8 illustrates the storage and lookup of filter tap coefficients in each ROM 422 of FIG. 6. Three address bits 481 are input on address bus 405, and ROM 422 retrieves the precomputed filter tap coefficient value 482 stored at the corresponding address in ROM. Each different input address value 481 maps to a corresponding trellis code value entered at the beginning of the precomputation process. The retrieved filter tap coefficient value 482 is output on data bus 404, which is connected to an XOR converter.

Figure 3:
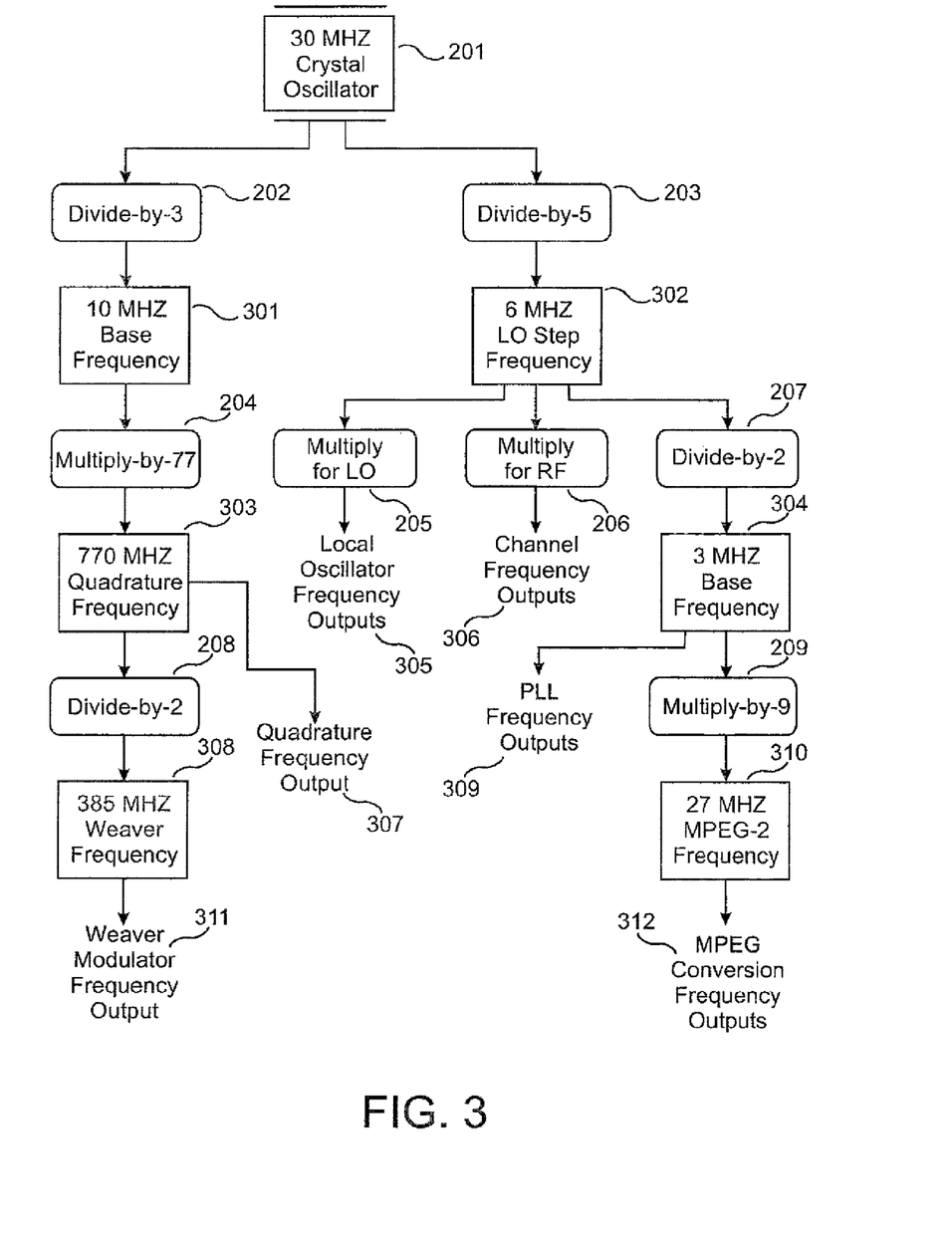
FIG. 3 shows the invention's use of a single crystal oscillator circuit to derive multiple carrier and timing frequencies.

To improve the economics of the modulator, the invention eliminates components and complexity through the use of the highest possible reference frequencies, effectively reducing spurious signals and phase noise. The invention derives all necessary reference frequencies from a single crystal oscillator, eliminating sets of components associated with additional oscillator circuitry. See FIG. 3. The invention's design selects an oscillator frequency using the following criteria:

The invention's choice of quartz crystal oscillator 201 frequency falls in the range of 10-30 MHz, which is optimal for cost and performance. The invention's range allows generation of 6 MHz frequencies for the local oscillator steps from a base of 6, 12, 18, 24, or 30 MHz.

In a 30 MHz crystal reference embodiment, the invention uses its candidate 30 MHz crystal frequency to create a 10 MHz frequency 301 using a divide-by-3 circuit 202. The invention then multiplies out 204 to a 770 MHz frequency 303, and then applies 208 a divide-by-two circuit to produce the 385 MHz center frequency 308 of the Weaver modulator. The invention readily uses the 770 MHz frequency 303 to provide the required quadrature.

In its 30 MHz crystal reference embodiment, the invention creates a 6 MHz step frequency 302 using a divide-by-5 circuit 203 to downconvert the 30 MHz oscillator input 201 to provide local oscillator frequencies 305 and RF channel frequencies 306. Using a divide-by-2 circuit 207, the invention also provides a 3 MHz base frequency 304 for PLLs and MPEG-2 use.

In its 30 MHz crystal reference embodiment, the invention's resulting high phase detector frequencies for all PLLs (3 MHz and above) allow the use of low-cost oscillators in all PLLs while still obtaining acceptable phase noise characteristics. This advantage is due to the high loop gain possible at low frequencies with a high phase detection frequency.

The invention derives the 27 MHz MPEG-2 video frequency by using a rate-multiplier PLL (phase-locked-loop), which constructs a multiple of the 3 MHz base frequency 304. The multiple is used in turn for creating 209 the 27 MHz frequency 310. The PLL design is usable since the phase noise restrictions are relatively less demanding during the processing of the MPEG-2 signal.

While the invention has been described with reference to preferred embodiments, it will be understood by those skilled in the art that various changes may be made and equivalents may be substituted for elements thereof to adapt to particular situations without departing from the scope of the invention. Therefore, it is intended that the invention not be limited to the particular embodiments disclosed as the best mode contemplated for carrying out this invention, but that the invention will include all embodiments falling within the scope and spirit of the appended claims.

The invention claimed is:

1. A low cost ATSC digital television modulator compatible with ATSC television receivers, comprising:
   a crystal oscillator circuit;
   a Weaver modulator circuit connected to the crystal oscillator circuit; and
   a digital-to-analog conversion circuit connected to the Weaver modulator, wherein
   the crystal oscillator circuit comprises:
   a crystal oscillator for producing a first frequency output;
   a first frequency-division circuit connected to the crystal oscillator first frequency output for producing a first base frequency output at a first fraction of the frequency of the crystal oscillator; and
   a second frequency-division circuit connected to the crystal oscillator first frequency output for producing a local-oscillator step frequency output at a second fraction of the frequency of the crystal oscillator;
   a third frequency-division circuit connected to the local-oscillator step frequency output for producing a second base frequency output at a first fraction of the frequency of the local-oscillator step frequency output;
   a first frequency multiplier circuit connected to the local-oscillator step frequency output for producing output video channel frequencies in steps according to the local-oscillator step frequency; and
   a second frequency multiplier circuit connected to the local-oscillator step frequency output for producing local oscillator channel frequencies in steps according to the local-oscillator step frequency; and
   a third frequency multiplier circuit connected to the second base frequency output for producing an MPEG-2 frequency output at a multiple of the frequency of the second base frequency output.

2. The apparatus of claim 1 wherein the crystal oscillator circuit further comprises:
   a fourth frequency multiplier circuit connected to the first base frequency output for producing a quadrature frequency output at a first multiple of the frequency of the first base frequency output; and a fourth frequency-division circuit connected to the quadrature frequency output for producing a Weaver modulator (fixed intermediate) frequency output at a fraction of the frequency of the quadrature frequency output.

3. The apparatus of claim 1 wherein the crystal oscillator circuit comprises:
a crystal oscillator for a first frequency output;
a divide-by-3 circuit connected to the crystal oscillator first frequency output for producing a first base frequency output at one-third of the frequency of the crystal oscillator; and
a divide-by-5 circuit connected to the crystal oscillator first frequency output for producing a local-oscillator step frequency output at one-fifth of the frequency of the crystal oscillator.

4. The apparatus of claim 3 wherein the crystal oscillator circuit further comprises:
a multiply-by-77 circuit connected to the first base frequency output for producing a quadrature frequency output at 77 times the frequency of the first base frequency output; and
a divide-by-2 circuit connected to the quadrature frequency output for producing a Weaver modulator (fixed intermediate) frequency output at one-half of the frequency of the quadrature frequency output.

5. The apparatus of claim 3 wherein the crystal oscillator circuit further comprises:
a divide-by-2 circuit connected to the local-oscillator step frequency output for producing a second base frequency output at one-half the frequency of the local-oscillator step frequency output;
a multiplier circuit connected to the local-oscillator step frequency output for producing output video channel frequencies in steps according to the local-oscillator step frequency; and
a multiply-by-9 circuit connected to the second base frequency output for producing an MPEG-2 frequency output at 9 times the frequency of the second base frequency output.

6. The apparatus of claim 1 wherein the Weaver modulator circuit comprises a finite-impulse-response (FIR) filter circuit.

7. The apparatus of claim 6 wherein the finite-impulse-response (FIR) filter circuit comprises:
a three-bit input video signal line;
a one-bit input clock signal line for shifting input video signals;
a plurality of shift registers (taps) connected in line to each other via a three-bit shift video signal line and a one-bit shift clock signal line, of which a first shift register is connected to the three-bit input video signal line and the one-bit input clock signal line;
an address decoder connected to each shift register;
a read-only memory connected to each address decoder for retrieving a coefficient value corresponding to each shift register value;
an arithmetic circuit connected to each read-only memory for multiplying each shift register value by the retrieved coefficient value to produce a filter register output value;
a balancing circuit connected to each arithmetic circuit and connected to the one-bit input clock signal line for incorporating the phase-shifted negative of the filter register output value to produce a balanced output value;
an adder circuit connected to each balancing circuit;
a signal bus connecting each adder circuit to the adder circuits connected via balancing circuits to the adjacent shift registers;
an accumulator circuit for summing the contents of all of the adder circuits.

8. The apparatus of claim 7 wherein the total number of shift registers (taps) connected sequentially to each other is no smaller in value than 31.

9. A method of producing a modulated television signal compatible with ATSC (Advanced Television Standards Committee) television receivers, comprising the steps of:
selecting an output television frequency band;
selecting a fixed IF (intermediate frequency) for amplification below the lowest frequency of the output television frequency band and above half the highest frequency of the output television frequency band;
selecting a local oscillator (LO) frequency band above the frequencies of the output television frequency band;
adopting a Weaver modulator circuit for use in filtering the input television signal;
selecting a number of finite-impulse-response (FIR) filter taps for the Weaver modulator circuit;
precomputing modified weights for the finite-impulse-response (FIR) filter taps of the Weaver modulator circuit;
storing the precomputed modified filter tap coefficients in read-only memory (ROM);
applying the modified Weaver modulator circuit to an MPEG-2 video input signal to produce a digital balanced-modulator vestigial-sideband signal;
converting the digital balanced-modulator vestigial-sideband signal to analog form.

10. The method of claim 9, wherein the step of selecting an output television frequency band further comprises the step of selecting an output television frequency band having uniformly-spaced channels.

11. The method of claim 9, wherein the step of selecting an output television frequency band having uniformly-spaced channels further comprises the step of selecting an output television frequency band comprising UHF (ultra-high-frequency) television channels 14 through 51.

12. The method of claim 9, wherein the step of selecting a fixed IF (intermediate frequency) further comprises the step of placing the IF geometrically the same ratio below the output television frequency band as the lowest local oscillator (LO) frequency is above the output television frequency band.

13. The method of claim 9, wherein the step of selecting a local oscillator (LO) frequency band further comprises the step of selecting the LO frequency as a multiple of 6 MHz.

14. The method of claim 13, wherein the step of selecting a local oscillator (LO) frequency band further comprises the step of adjusting the IF frequency in a 6 MHz increment or submultiple thereof.

15. The method of claim 13, wherein the step of selecting a fixed IF (intermediate frequency) further comprises the step of selecting an IF frequency in the range of 382-388 MHz.

16. The method of claim 15, wherein the step of selecting a fixed IF (intermediate frequency) in the range of 382-388 MHz further comprises the step of selecting an IF frequency of 385 MHz.

17. The method of claim 15, wherein the step of selecting a fixed IF (intermediate frequency) further comprises the step of adjusting the IF frequency in a 6 MHz increment or submultiple thereof.

18. The method of claim 9, wherein the step of selecting a number of finite-impulse-response (FIR) filter taps for the Weaver modulator circuit further comprises the steps of:
- computing the minimum number of filter taps that can produce root-raised-cosine responses to ATSC specification;
- using the minimum number of filter taps computed in the previous step as the number of filter taps for the Weaver modulator.

19. The method of claim 9, wherein the step of selecting a number of finite-impulse-response (FIR) filter taps for the Weaver modulator circuit further comprises the steps of:
- computing the minimum number of filter taps that can produce root-raised-cosine responses to ATSC specification;
- using the minimum number of filter taps computed in the previous step, minus 1, as the number of filter taps for the Weaver modulator.

20. The method of claim 9, wherein the step of precomputing modified weights for the finite-impulse-response (FIR) filter taps of the Weaver modulator circuit further comprises the steps of:
- selecting trellis coefficient values;
- selecting a carrier frequency offset value;
- selecting a digital-to-analog (D-to-A) converter;
- adding the carrier frequency offset value to each trellis coefficient value to produce a multiplier factor, thereby eliminating a separate pilot carrier insertion step during signal processing;
- computing conventional filter tap coefficients (filter tap weights) for a Weaver modulator FIR filter;
- multiplying each conventional filter tap coefficient by each multiplier factor to produce a modified filter tap coefficient for each trellis value, thereby eliminating a separate trellis coding step during signal processing;
- normalizing the modified filter tap coefficients to use the full dynamic range of the D-to-A converter, producing normalized filter tap coefficients;
- extending the normalized filter tap coefficient size to absorb rounding errors, producing extended filter tap coefficients;
- storing each extended filter tap coefficient in read-only memory (ROM) addressable by the trellis value.

21. The method of claim 20, wherein the step of normalizing the modified filter tap coefficients to use the full dynamic range of the D-to-A converter further comprises the steps of:
- determining the highest total filter tap coefficient value to be produced during FIR filter operation;
- determining the maximum input signal level during FIR filter operation;
- multiplying the highest total filter tap coefficient value by the maximum input signal level to produce a maximum expected input D-to-A value;
- determining the maximum usable signed input value for the D-to-A converter;
- computing the ratio of the maximum usable signed input value to the maximum expected input D-to-A value to produce a weight scaling factor;
- multiply each modified filter tap coefficient by the weight scaling factor to produce a normalized filter tap coefficient.

22. The method of claim 20, wherein the step of extending the normalized filter tap coefficient size to absorb rounding errors, producing extended filter tap coefficients further comprises the steps of:
- dividing the number of FIR filter stages by 2 and rounding the result upward to produce a filter tap coefficient size increment;
- adding 1 to the filter tap coefficient size increment to provide an extended filter tap coefficient size increment for correct rounding of filter calculations;
- adding the extended filter tap coefficient size increment to the input signal size to produce an extended filter tap coefficient size.

23. The method of claim 9, wherein the step of applying the modified Weaver modulator circuit to an MPEG-2 video input signal to produce a digital balanced-modulator vestigial-sideband signal further comprises the steps of:
- passing an input MPEG-2 video signal through the stages of the FIR filter;
- in each stage of the filter, computing a ROM address using the input MPEG-2 video signal;
- in each stage of the filter, retrieving a precomputed modified filter stage tap coefficient value from the ROM using the computed ROM address;
- producing the digital modulation waveform using the retrieved filter tap coefficient values;
- producing a polarity-reversed copy of the digital modulation waveform using the negatives of the retrieved filter tap coefficient values, thereby producing a precise quadrature signal;
- producing a balanced modulator digital output signal using the digital modulation waveform and the polarity-reversed copy of the digital modulation waveform to produce a digital balanced-modulator vestigial-sideband signal, thereby eliminating a separate balanced modulator processing step.

24. The method of claim 23, wherein the step of applying the modified Weaver modulator circuit to an MPEG-2 video input signal to produce a digital balanced-modulator vestigial-sideband signal further comprises the steps of:
- passing an input MPEG-2 video signal through a Reed-Solomon encoder to produce a block-encoded MPEG-2 video signal;
- passing the block-encoded MPEG-2 video signal through a randomizer circuit to produce a uniformly-distributed MPEG-2 video signal.

25. The method of claim 23, wherein the step of producing a polarity-reversed copy of the digital modulation waveform using the negatives of the retrieved filter tap coefficient values further comprises the steps of:
- providing a control signal at the balanced modulator carrier frequency; and
- applying said control signal to generate the ones-complement (XOR) of each filter tap coefficient value, thereby producing a polarity-reversed copy of the digital modulation waveform as a quadrature output;
- delaying the output of the polarity-reversed copy of the digital modulation waveform by ninety degrees of phase of the input carrier frequency, thereby providing the polarity-reversed copy of the digital modulation waveform as a precise quadrature signal, and also thereby avoiding duplication of the FIR filter.

* * * * *